United States Patent [19]

Ghosh et al.

[11] Patent Number: 5,484,629
[45] Date of Patent: Jan. 16, 1996

[54] COATING APPARATUS AND METHOD

[75] Inventors: Syamal K. Ghosh, Rochester; Roy O. Hopkins, Spencerport; Kenneth G. Budinski, Rochester; Mark S. Kohler, Spencerport, all of N.Y.

[73] Assignee: Eastman Kodak Company, Rochester, N.Y.

[21] Appl. No.: 68,468

[22] Filed: May 27, 1993

[51] Int. Cl.⁶ .................. C23C 16/22; B05D 1/26; B05D 1/30
[52] U.S. Cl. .................. 427/255; 427/420; 118/410; 118/411; 118/DIG. 4
[58] Field of Search .................. 427/255, 420; 118/410, 411, DIG. 4; 419/49

[56] References Cited

U.S. PATENT DOCUMENTS

| | | | |
|---|---|---|---|
| 4,230,745 | 10/1980 | Betz et al. | 427/255 |
| 4,612,146 | 9/1986 | Huther | 264/29.6 |
| 4,738,885 | 4/1988 | Matsumoto | 428/64 |
| 4,744,943 | 5/1988 | Timm | 419/49 |
| 4,761,332 | 8/1988 | Elias et al. | 428/325 |
| 4,816,128 | 3/1989 | Wada et al. | 204/192.23 |
| 4,997,678 | 3/1991 | Taylor et al. | 427/255 |
| 5,080,841 | 1/1992 | Nishio | 419/49 |
| 5,275,660 | 1/1994 | Ozaki et al. | 118/410 |

FOREIGN PATENT DOCUMENTS

| | | |
|---|---|---|
| 0361167A | 9/1989 | European Pat. Off. . |
| 60-161383 | 8/1985 | Japan .................. 427/255 |

Primary Examiner—Shrive Beck
Assistant Examiner—Katherine A. Bareford
Attorney, Agent, or Firm—Carl F. Ruoff; Arthur H. Rosenstein

[57] ABSTRACT

A coating apparatus (10) for coating a radiation-sensitive emulsion (30) on a photographic support (24) is fabricated from hopper bars (12) having a ceramic coating surface (20). An initial surface finish treatment is first applied to the ceramic coating surface, after which the coating surface is polished, to decrease the roughness of the coating surface sufficiently to prevent the formation of streaks in the emulsion coating layer or layers on the support.

11 Claims, 5 Drawing Sheets

COATING APPARATUS AND METHOD

FIELD OF INVENTION

The invention relates to an apparatus and method for emulsion coating of a photographic support. More particularly, the invention relates to such apparatus and method for forming an emulsion coating that is substantially free from streaks or other defects.

BACKGROUND OF THE INVENTION

There exist various methods and apparatuses for coating a photographic support. One such coating system uses a bead coating hopper. Another system employs a curtain coating hopper. These systems are used in coating the surface of a support with single or multiple coatings, the latter of which can be coated simultaneously onto the support. The fabrication of photographic light-sensitive elements typically requires the simultaneous coating of multiple emulsion layered on the support.

The coating apparatus, and in particular the coating hopper, can be fabricated from various materials, the selection of which depends largely on the coating environment. To avoid the introduction of contaminants into the product and to prolong the working life of the apparatus, photographic emulsion-coating apparatus is typically fabricated from materials such as AISI 304 or 316 stainless steel which possess good resistance to corrosion and wear. Stainless steel, however, has the drawback of also possessing a high coefficient of thermal expansion, which at high coating temperatures such as at 50 to 100 degrees C. can result in non uniform coatings due to dimensional nonuniformities in the coating hopper caused by uneven thermal expansion, especially with multiple coating hoppers. Multiple hoppers comprise multiple hopper bars stacked one on another, each bar typically about 5 feet long, 6 inches wide, and 2 inches thick and having an intake slot and a discharge slot. The size and configuration of the slot openings tends to fluctuate appreciably due to changes in the emulsion coating temperature and due to bending in the coating bars caused by their weight. Also, streaks and other imperfections can be introduced into the coated layer or layers. The streaks and coating nonuniformities are often considered minor and acceptable in many non photographic coating applications. Even minor such defects, however, can be unacceptable in photographic applications, because they can lead to optical distortion in a developed photographic image that becomes even more apparent and significant upon enlargement or in products having to meet high quality standards, such as professional photographic film and paper products and motion picture film.

EPA 0361167 discloses a coating apparatus fabricated from a sintered or hot-pressed ceramic material having a higher modulus of elasticity and a lower coefficient of thermal expansion than a metal such as stainless steel. A drawback, however, is that sintered and hot-pressed ceramics are porous and have other surface irregularities, which will be collectively referred to herein as "voids". Voids provide sites upon which a coating liquid can accumulate and interfere with the smooth, continuous flow of the coating liquid, thereby introducing nonuniformities and streaks into the coating layer or layers. Unlike stainless steel, the porosity of such ceramics can cause voids on the coating hopper lip where the coating or coatings flow from the hopper to the photographic support which also introduces streaks and other defects into the coating layers. Another problem caused by the presence of voids is that solidification of accumulated coating liquid in the voids causes difficulty in cleaning the coating apparatus, resulting in more out-of-service time of the equipment.

It is therefore an object of the invention to provide a ceramic photographic emulsion coating apparatus and method for producing emulsion coatings on photographic supports coatings that are uniform and substantially free of streaks.

SUMMARY OF THE INVENTION

The present invention is directed to overcoming one or more of the problems set forth above. Briefly summarized, according to one aspect of the present invention, there is provided, in a coating apparatus for coating a radiation-sensitive emulsion on a photographic support, the coating apparatus comprising a coating hopper having a hopper bar having a ceramic coating surface thereon, the improvement wherein the ceramic coating surface has an initial non-polishing surface finish treatment applied thereto and a final polishing treatment whereby the roughness of the coating surface is sufficiently decreased to prevent the formation of streaks in the emulsion coating on the support.

In another aspect of the invention, there is provided a method of preparing a photographic coating apparatus useful in coating a streak-free radiation-sensitive emulsion coating on a photographic support, comprising the steps of:

preparing a ceramic coating hopper comprising a hopper bar having a coating surface thereon;

applying an initial, non-polishing surface finish treatment to the coating surface; and polishing the coating surface, whereby the roughness of the coating surface is sufficiently decreased to prevent the formation of streaks in the emulsion coating on the support.

The invention yields uniform emulsion coatings that are substantially free from streaks. The hopper, and in particularly the hopper lip profile, provide good coating flow stream characteristics leading to minimal discontinuities in the emulsion coating layer or layers. The coating apparatus can be easily cleaned and maintained and does not require substantial down-time in order to clean out the pores or other surface irregularities to maintain its coating efficacy.

These and other aspects, objects, features and advantages of the present invention will be more clearly understood and appreciated from a review of the following detailed description of the preferred embodiments and appended claims, and by reference to the accompanying drawings.

DESCRIPTION OF THE PREFERRED EMBODIMENTS

Figure 1:
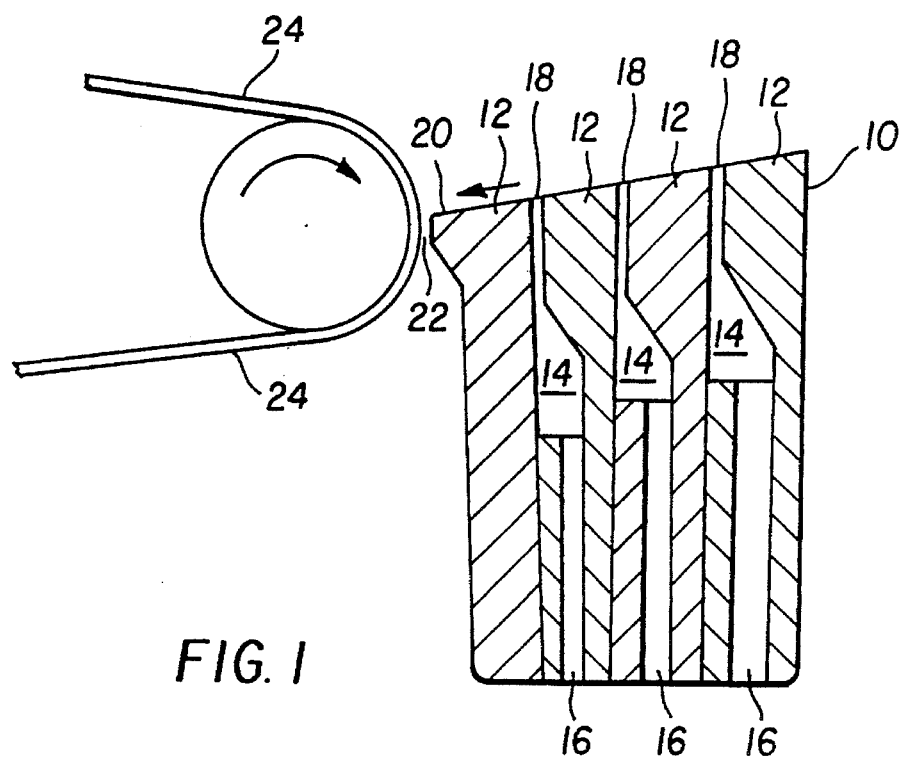
FIG. 1 is a sectional elevation view of a multi-bar hopper positioned next to a moving web in accordance with the invention.

FIG. 1 illustrates a coating apparatus in accordance with the invention. Coating hopper 10 is a multi-bar bead coating hopper comprising multiple ceramic hopper bars 12 that define channels 14 therebetween. A coating liquid is provided via feed conduits 16 to channels 14. Coating liquid exits through each slot 18 to form a multiple layered stream that flows along hopper coating surface 20 toward lip 22 as indicated by the direction arrow. The stream is discharged at lip 22 onto web 24 as it moves past lip 22, thereby coating multiple layers onto web 24.

Ceramic hopper bars 12 are prepared from a powder mixture, comprising a starting ceramic material and a binder. The starting ceramic material can comprise oxide ceramics, such as alumina, zirconia, mullite, forsterite and zircon, nitride ceramics such as silicon nitride, titanium nitride, aluminum nitride, boron nitride and oxy-nitride, and carbide ceramics such as silicon carbide, titanium carbide, tungsten carbide and chromium carbide, or mixtures of any such ceramics. Any suitable binder, such as a wax emulsion, PVA, or PEG, can be used. Optionally, a sintering aid, such as $SiO_2$, MgO, or CaO, can be admixed with the powder mixture, which can also include a dopant such as a rare earth metal to obtain improved strength or wear, a specific morphology or crystalline phase, or other such desired material properties. Preferred rare earth dopants are yttrium and cesium.

The starting powder is press-molded into a green form, as in a die of the desired shape, after which it is sintered. One skilled in the art can determine the appropriate sintering schedule and sintering atmosphere for the particular application. For example, the sintering can comprise ramping from room temperature to a first sintering temperature at a selected rate, followed either by ramping at a different rate or maintaining a desired temperature, or any desired combination of such steps, until obtaining the highest desired sintering temperature. The sintered material is cooled down in a likewise fashion, and optionally quenched, to form the sintered ceramic hopper bar 12.

Figure 2:
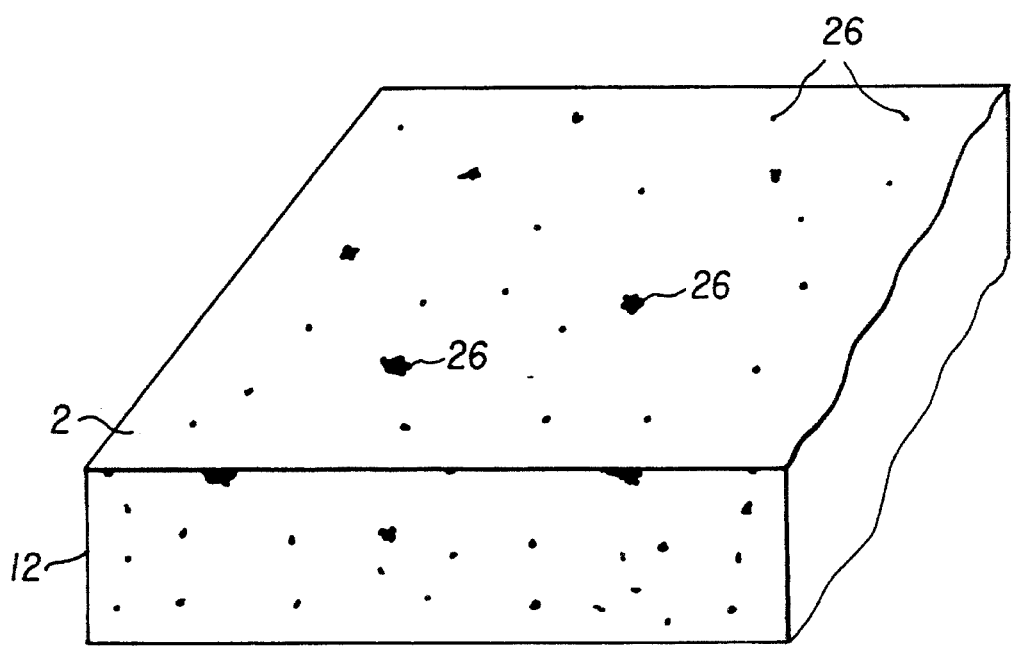
FIG. 2 is a perspective, enlarged, fragmentary view of a ceramic coating surface without the surface finish treatment of the invention.
Figure 3:
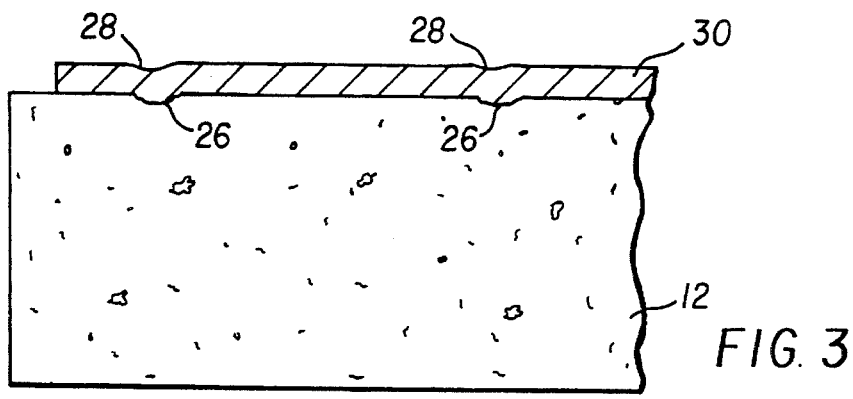
FIG. 3 is a view taken along section 3—3 of FIG. 2 and further illustrating streaks introduced in an emulsion coating flow stream by underlying voids present in the ceramic coating surface.

FIG. 2 is a view of a hopper bar 12 showing the presence of voids 26 in coating surface 20. Voids are similarly present within the ceramic body that are not open to coating surface 20. FIG. 3 illustrates streaks 28 introduced in an emulsion coating flow stream 30 by underlying voids 26, which can cause similar streaks in the emulsion layer or layers on a photographic paper or film support and lead to optical distortion in a processed photographic image. A mechanical polishing such as grinding and lapping can decrease the depth and size of voids 26, but in the process other subsurface voids are brought to the surface; thus, the surface can retain a high degree of roughness even after polishing, the extent of which can depend on the type of ceramic and the method used to prepare the ceramic.

The first step in preparing the improved coating apparatus of the invention is to treat each ceramic hopper bar 12 with an initial, non-polishing surface finish treatment. Optionally, after sintering and before the initial non-polishing surface treatment, coating surface 20 can be grinded and/or polished if desired, such as to machine or prep the surface. In one preferred initial surface finish treatment of the invention, a hopper bar 12 is subjected to hot isostatic pressing ("HIP") by placing it in a chamber in which isostatic pressure and high temperature are maintained. Another preferred initial non-polishing surface finish treatment of the invention is a chemical vapor deposition ("CVD") of a chemical coating, which can be applied either selectively or over entire surfaces of a hopper bar 12. A preferred CVD coating thickness is in the range of from about 0.01 inch (0.025 cm) to about 0.05 inch (0.125 cm). The CVD coating and the ceramic surface should have similar coefficients of linear thermal expansion, which can best be obtained by using a CVD material identical or similar to the ceramic surface. For example, a silicon carbide CVD coating has good deposition compatibility with a silicon carbide ceramic hopper bar.

The initial non-polishing surface treatment is followed by a final finish treatment, such as a surface grinding or polishing, in order to obtain the desired improvement in surface roughness. The treated surfaces can be mechanically finished as by grinding or lapping, or polished using an abrasive material like diamond particles. Grinding can be carried out with diamond particles in the size range of from about 2000 micro-inch (50 microns) to about 8000 micro-inch (200 microns). Lapping or polishing can be carried out with diamond particles smaller than 2000 micro-inch (50 microns). Greater improvement in surface roughness is obtained by polishing with particles as small as 10 micro-inch (0.25 micron). After the final surface finish treatment, a preferred average surface roughness is in the range of from about 2 micro-inch (0.05 micron) to about 4 micro-inch (0.1 micron).

Figure 4A:
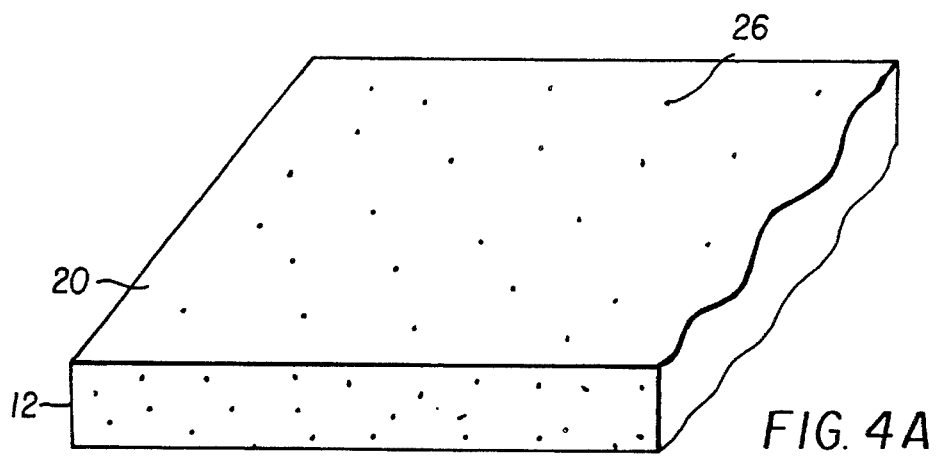
FIG. 4A is a perspective, enlarged, fragmentary view of a ceramic coating surface having a hot isostatic pressing surface treatment in accordance with the invention.
Figure 4B:
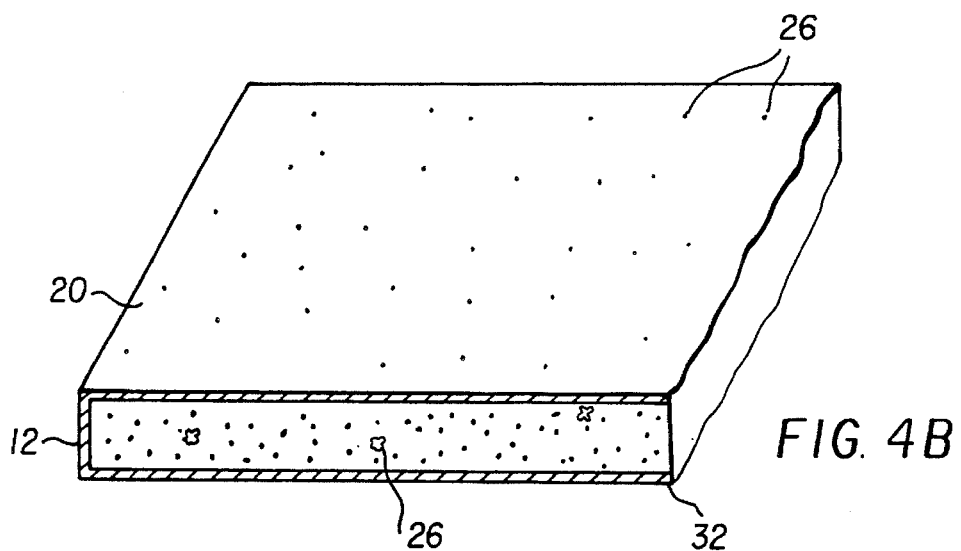
FIG. 4B is a perspective, enlarged, fragmentary view of a ceramic coating surface having a chemical vapor deposition treatment in accordance with the invention.

FIG. 4A illustrates a coating surface 20 treated by HIP and then polished, showing the decreased size and number of voids 26 and the more regular surface thus obtained. FIG. 4B illustrates a coating surface 20 having a CVD treatment followed by polishing. Chemical layer 32 is deposited on coating surface 20 and polished, decreasing the size and number of voids 26 and improving the surface roughness.

Although FIG. 1 shows a multi-slide hopper, the coating hopper of the invention can comprise any convenient coating hopper design, such as a multi-extrusion hopper, a curtain hopper, a multi-extrusion curtain or slide hopper, or a slide-type curtain hopper, as are well known in the photographic emulsion coating art. The hopper is typically mounted on a mounting bed (not shown).

The invention is further illustrated by the following examples.

Example 1

A hopper bar was fabricated from a starting powder comprising the following components by weight:

| | |
|---|---|
| Alumina | 99% |
| Magnesium oxide | 1% |

Figure 5:
FIG. 5 is a surface roughness profile of an alumina ceramic hopper without the surface finish treatment of the invention.

A binder (Polyvinyl alcohol ("PVA")) was mixed with the starting powder in an amount of 3.5% by weight therewith and the contents placed in a hopper bar die mold. 15,000 psi was applied to the die mold to form a green part hopper bar. The green part was then sintered at a temperature of 1800 degrees C. to form the ceramic hopper bar and the surfaces were grinded and polished. FIG. 5 shows a surface trace of the polished hopper bar surface at a magnification of 100× in the X and Y-axes and 2,000× in the Z-axis. The average roughness was 44.4 micro-inch (1.1 micron).

Example 2

Figure 6:
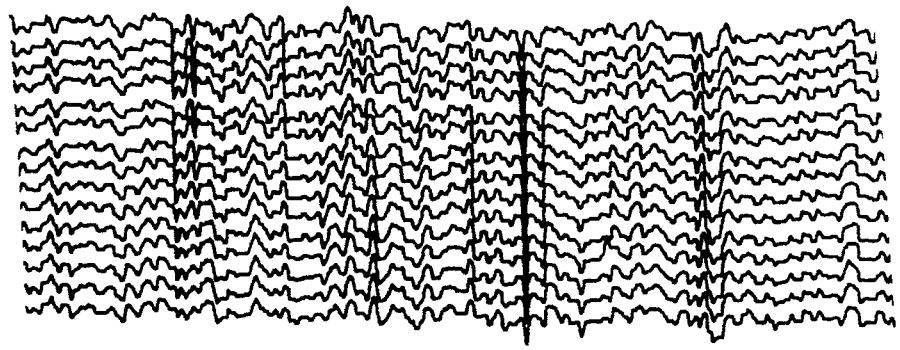
FIG. 6 is a surface roughness profile of a ceramic zirconia hopper without the surface finish treatment of the invention.

A hopper bar was fabricated as in Example 1 but from a starting powder comprising 97 mole % zirconia and 3 mole % $Y_2O_3$. FIG. 6 shows a surface trace of the polished hopper bar surface at a magnification of 100× in the X and Y-axes and 10,000× in the Z-axis. The average roughness was 3.4 micro-inch (0.085 micron).

Example 3

A hopper bar was fabricated as in Example 1 but at a sintering temperature between 2000 and 2100 degrees C. and from a starting powder comprising:

| | |
|---|---|
| Silicon carbide | 99% by weight |
| Boron | 1% by weight |

Figure 7:
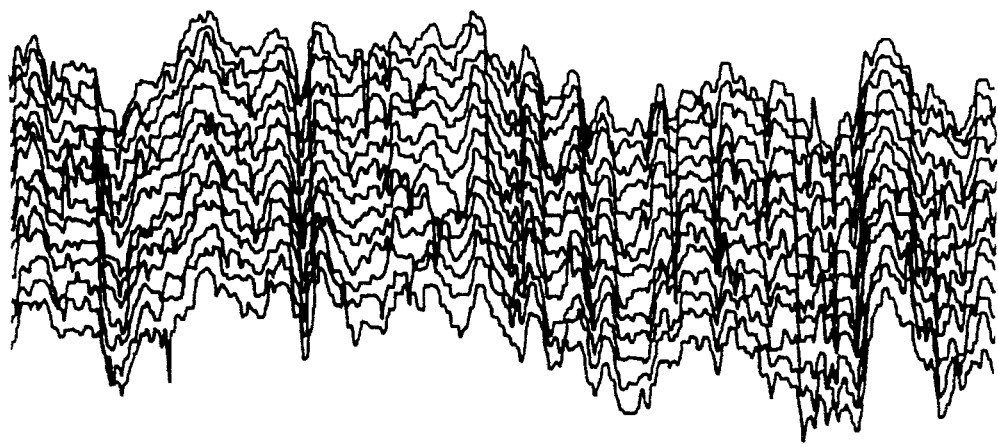
FIG. 7 is a surface roughness profile of a ceramic silicon carbide hopper without the surface finish treatment of the invention.

FIG. 7 shows a surface trace of the polished hopper bar surface at a magnification of 100× in the X and Y-axes and 10,000× in the Z-axis. The average roughness was 12 micro-inch (0.3 micron).

The size of the surface pores or voids in the hopper bars fabricated in Examples 1–3 was generally in the range of about 40 micro-inch (1 micron) to about 2000 micro-inch (50 micron). Grinding and lapping produced a pore size range of about 200 micro-inch (5 micron) to about 2000 micro-inch (50 micron).

Example 4

Figure 8:
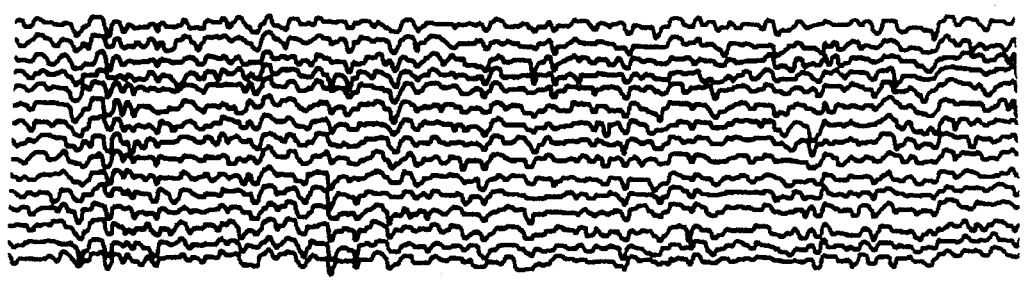
FIG. 8 is a surface roughness profile of a ceramic zirconia hopper having a hot isostatic pressing surface treatment according to the invention.
Figure 9:
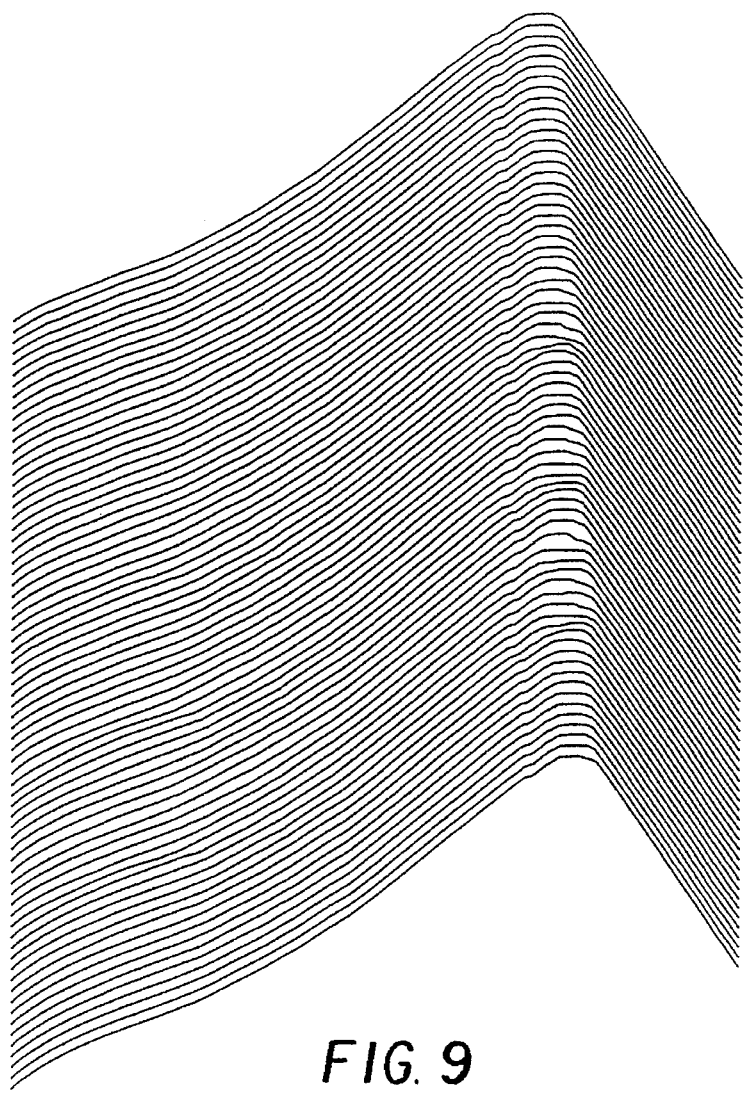
FIG. 9 is a trace of the lip geometry of a HIP-treated zirconia ceramic hopper bar.

A starting powder comprising 3 mole % $Y_2O_3$ and 97 mole % zirconia was formed as in the above examples into a green part and sintered at a temperature of 1250 degrees C. The sintered ceramic was then placed in a HIP furnace in an argon atmosphere at a pressure of 25,000 psi and heated to a temperature of 1550 degrees C. The ceramic hopper bar was then post-annealed in an air furnace at 1000 degrees C. The surfaces were then grinded and polished using abrasive diamond particles. First, a rough grinding was applied to remove excess stock and to size the bar close to the final dimension. This was carried out using a resin-bonded 150 mesh diamond wheel having an average particle size of 100 micron. 0.0001 inch of material was thus removed. Then, the bar surfaces were grinded using a 400 mesh resin-bonded diamond wheel having an average particle size of 40 micron. This resulted in a surface roughness of between 20 micro-inch (0.5 micron) and 30 micro-inch (0.75 micron). The bar surfaces were then lap-polished with a suspended slurry of fine-mesh diamond particles having a size of from 800 micro-inch (20 micron) to 10 micro-inch (0.25 micron). FIG. 8 shows a surface trace of the polished HIP-treated zirconia hopper bar at a magnification of 100× in the X and Y-axes and 10,000× in the Z-axis. The average roughness was 1.9 micro-inch, an improvement over the non-treated hopper bar of Example 2. FIG. 9 shows the trace of the lip geometry of the polished HIP-treated zirconia hopper bar at a magnification of 200× in the X and Y-axes and 100× in the Z-axis, which demonstrates a smooth and continuous lip surface configuration.

It was found that alumina, silicon carbide, and silicon nitride hopper bars having thicknesses greater than about 0.5 inch cracked when treated by HIP at the stated pressures. HIP treatment of a hopper bar having a thickness greater than 2 inches that was fabricated with 97 mole % zirconia and 3 mole % yttria produced a crack-free hopper bar useful in typical coating applications.

Example 5

A SiC hopper bar was prepared as in Example 3 and placed in a CVD reactor. Silane gas ($SiH_4$) and methane gas were provided to the reactor and the reactor was brought to a temperature in excess of 1000 degrees C. The gases reacted to deposit at a rate of 10 to 50 Angstroms/min. A number of hopper bars were prepared in this manner but having different thicknesses of the deposited layer. Depending on reaction time and rate, the SiC CVD coating had a thickness in the range of from 0.01 inch (0.025 cm) to 0.05 inch (0.125 cm). A thickness of 0.01 inch (0.025 cm) allows for a final polishing step without resulting in localized or general stripping of an entire thickness of coating layer. At a thickness greater than about 0.05 inch (0.125 cm), some cracking of the deposited layer was observed.

Figure 10:
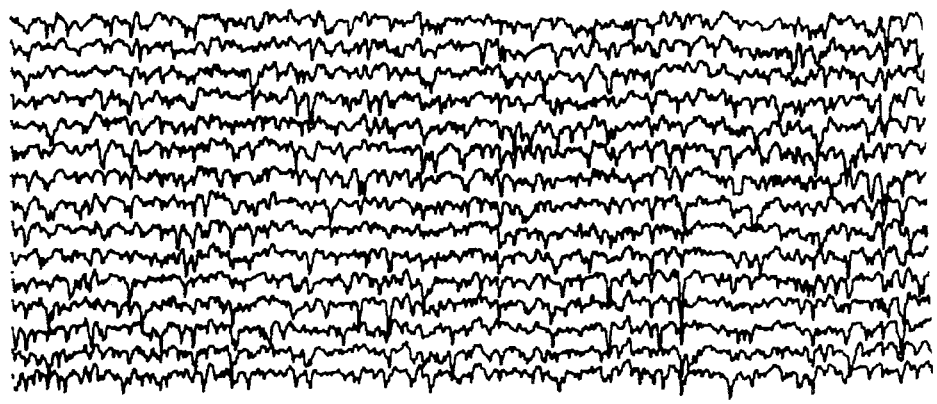
FIG. 10 is a surface roughness profile of a ceramic silicon carbide hopper having a chemical vapor-deposited overcoat finish according to the invention.

FIG. 10 shows a surface trace of a polished CVD SiC-coated SiC hopper bar at a magnification of 100× in the X and Y-axes and 10,000× in the Z-axis. The average roughness was 2.1 micro-inch (0.05 micron), a substantial improvement over the 12 micro inch (0.3 micron) of as—sintered SiC.

Figure 11:
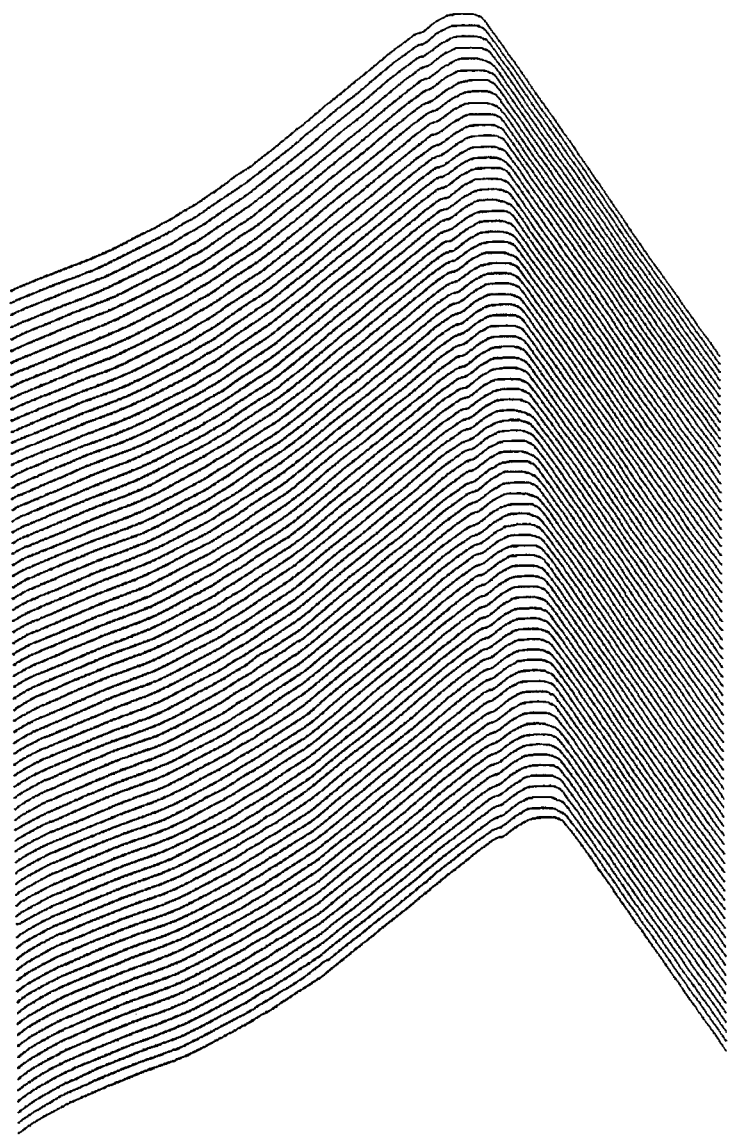
FIG. 11 is a trace of the lip geometry of a CVD SiC coated SiC hopper bar.

FIG. 11 shows a trace of the lip geometry of the CVD SiC-coated SiC hopper bar at a magnification of 200× in the X and Y-axes and 100× in the Z-axis, which demonstrates a smooth and continuous lip surface configuration.

The invention has been described in detail with particular reference to a preferred embodiment thereof, but it will be understood that variations and modifications can be effected within the spirit and scope of the invention.

We claim:

1. A method of preparing a photographic coating apparatus useful in coating a streak-free radiation-sensitive emulsion coating on a photographic support, comprising the steps of:

preparing a ceramic coating hopper comprising a hopper bar having a ceramic surface consisting essentially of silicon carbide and zirconia contacted by coating thereon; applying an initial, non-polishing surface finish treatment to the coating surface; and polishing the coating surface, whereby the roughness of the coating surface is sufficiently decreased to prevent the formation of streaks in the emulsion coating on the support wherein the initial surface finish treatment comprises an overcoat layer formed by chemical vapor-deposition.

2. The method of claim 1, wherein the surface finish has a thickness in the range of from 0.01 inch to 0.05 inch.

3. The method of claim 2, wherein the coating surface after polishing has an average roughness in the range of from about 2 micro-inch to about 4 micro-inch.

4. The method of claim 3, wherein the coating hopper comprises a plurality of said hopper bars having said initial surface finish treatment and polishing applied thereto.

5. In a coating apparatus for coating a radiation-sensitive emulsion on a photographic support, the coating apparatus comprising a coating hopper bar having a ceramic surface selected from the group consisting of silicon carbide and zirconia contacted by coating thereon, wherein the ceramic surface has an initial non-polishing surface finish treatment applied thereto and a final polishing treatment whereby the roughness of the coating surface is sufficiently decreased to prevent the formation of streaks in the emulsion coating on the support the improvement wherein the initial surface finish treatment comprises an overcoat layer formed by chemical vapor-deposition.

6. The apparatus of claim 5, wherein the overcoat has a thickness in the range of from 0.01 inch to 0.05 inch.

7. The apparatus of claim 5, wherein said initial surface finish treatments comprise hot isostatic pressing and chemical vapor-deposition of an overcoat layer.

8. The apparatus of claim 5, wherein each initial surface finish treatment comprises chemical vapor-deposition of an overcoat layer.

9. The apparatus of claim 8, wherein the initial surface finish has a thickness in the range of from about 0.01 to about 0.05 inch.

10. In a coating apparatus for coating a radiation-sensitive emulsion on a photographic support, the coating apparatus comprising a plurality of hopper bars each having a ceramic surface contacted by coating thereon, the improvement wherein each coating surface has an overcoat layer selected from the group consisting of silicon carbide and zirconia formed thereon by chemical vapor-deposition having a thickness in the range of from about 0.01 to about 0.05 inch, and each coating surface has a final polishing, whereby the roughness of each coating surface is sufficiently decreased to prevent the formation of streaks in the emulsion coating on the support.

11. The apparatus of claim 10, wherein each coating surface after polishing has an average roughness in the range of from about 2 micro-inch to about 4 micro-inch.

* * * * *